US012684890B1

(12) United States Patent
Li et al.

(10) Patent No.: US 12,684,890 B1
(45) Date of Patent: Jul. 14, 2026

(54) METHOD FOR PREPARING SOLAR CELL

(71) Applicant: JINKO SOLAR (HAINING) CO., LTD., Haining City (CN)

(72) Inventors: Xian Li, Haining (CN); Feng Liu, Haining (CN); Yuanfang Zhang, Haining (CN); Zhao Wang, Haining (CN); Peiting Zheng, Haining (CN); Jie Yang, Haining (CN); Xinyu Zhang, Haining (CN); Chenglan Zhang, Haining (CN)

(73) Assignee: JINKO SOLAR (HAINING) CO., LTD., Haining City (CN)

( * ) Notice: Subject to any disclaimer, the term of this patent is extended or adjusted under 35 U.S.C. 154(b) by 0 days.

(21) Appl. No.: 19/364,084

(22) Filed: Oct. 21, 2025

(30) Foreign Application Priority Data

Jul. 30, 2025   (CN) .......................... 202511062050.7

(51) Int. Cl.
H10F 71/10 (2025.01)
H10F 71/00 (2025.01)
H10F 77/70 (2025.01)

(52) U.S. Cl.
CPC ......... H10F 71/103 (2025.01); H10F 71/134 (2025.01); H10F 77/703 (2025.01)

(58) Field of Classification Search
None
See application file for complete search history.

(56) References Cited

U.S. PATENT DOCUMENTS

2024/0072196 A1   2/2024  Xu et al.

FOREIGN PATENT DOCUMENTS

| CN | 109216474 A | 1/2019 | |
|----|-------------|--------|----------------|
| CN | 111834491 A | * 10/2020 | .............. H10P 34/42 |
| CN | 114582714 A | 6/2022 | |
| CN | 115588698 A | 1/2023 | |
| CN | 118412406 A | 7/2024 | |
| CN | 119277834 A | 1/2025 | |
| CN | 119300521 A | 1/2025 | |

(Continued)

OTHER PUBLICATIONS

English machine translation of Yuan (CN-111834491-A) provided by the EPO, All Pages, 2026. (Year: 2026).*

(Continued)

*Primary Examiner* — Daniel P Malley, Jr.
(74) *Attorney, Agent, or Firm* — Dority & Manning, PA

(57) ABSTRACT

Provided are a method for preparing a solar cell, a solar cell, and a photovoltaic module. The method for preparing a solar cell includes: performing double-sided texturing on a silicon substrate; performing boron diffusion on the silicon substrate to form a boron diffusion layer and a borosilicate glass layer on both a front side and a back side of the silicon substrate; the front side of the silicon substrate having a first region and a second region, and removing the borosilicate glass layer and the boron diffusion layer in the second region by using laser, wherein wet oxygen and dry oxygen are introduced during the boron diffusion on the silicon substrate with a ratio $\omega$ of the wet oxygen to the dry oxygen satisfying $0\% < \omega \le 20\%$; a density $\rho 1$ of the borosilicate glass layer satisfies $1.32 \text{ g/cm}^3 < \rho 1 \le 2.65 \text{ g/cm}^3$.

20 Claims, 4 Drawing Sheets

(56)          References Cited

FOREIGN PATENT DOCUMENTS

| CN | 119677210 A | 3/2025 |
| CN | 119789584 A | 4/2025 |
| WO | WO 2024/146295 A1 | 7/2024 |
| WO | WO 2025/092473 A1 | 5/2025 |

OTHER PUBLICATIONS

Extended European Search Report received in corresponding Application No. EP 25210031.8, dated Apr. 24, 2026, 10 pages.

* cited by examiner

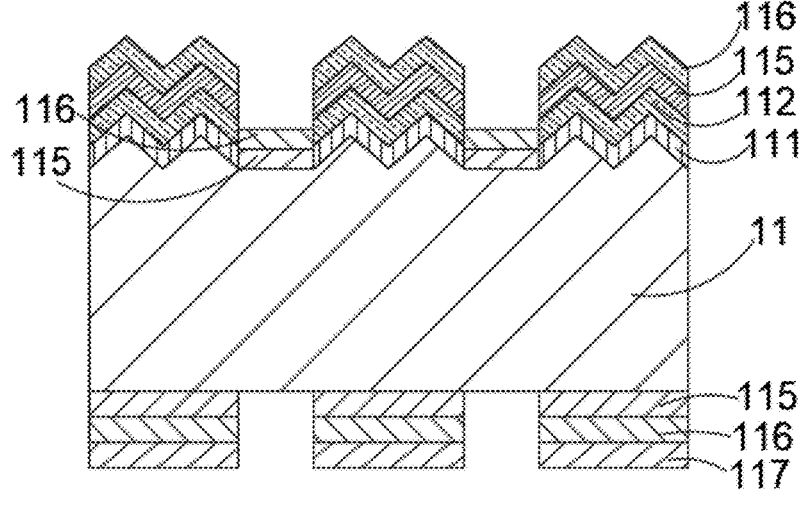
FIG. 9
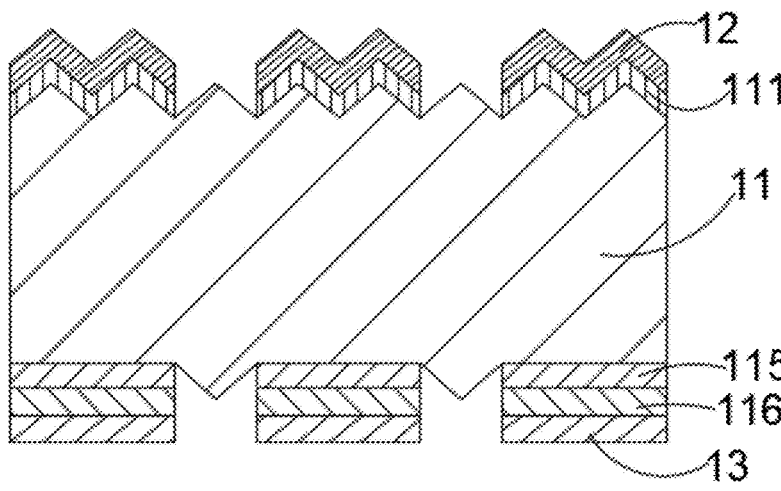
FIG. 10
FIG. 11

METHOD FOR PREPARING SOLAR CELL

CROSS-REFERENCE TO RELATED APPLICATION

This application claims priority to Chinese patent application No. 202511062050.7, entitled "METHOD FOR PREPARING SOLAR CELL, SOLAR CELL, AND PHOTOVOLTAIC MODULE" filed on Jul. 30, 2025, the content of which is hereby incorporated by reference in its entirety.

TECHNICAL FIELD

The present application relates to the technical field of photovoltaic modules, and specifically to a method for preparing a solar cell, a solar cell, and a photovoltaic module.

BACKGROUND

Photovoltaic cells, which can convert solar energy into electrical energy, offer advantages such as no pollution, no geographical restrictions, and inexhaustibility, and are regarded as a major direction in new energy development. As a type of photovoltaic cell, Topcon cells significantly improve photoelectric conversion efficiency by providing a passivation contact structure composed of an ultra-thin silicon oxide layer and a doped polysilicon layer. However, during the preparation of TOPCon cells, lasers are prone to causing thermal damage to the silicon substrate, compromising the preparation quality.

SUMMARY

Embodiments of the present application provide a method for preparing a solar cell, a solar cell, and a photovoltaic module, to address the technical issue that laser patterning is prone to causing thermal damage in the prior art.

In a first aspect, an embodiment of the present application provides a method for preparing a solar cell, the method including:

performing double-sided texturing on a silicon substrate;

performing boron diffusion on the silicon substrate to form a boron diffusion layer and a borosilicate glass layer on both a front side and a back side of the silicon substrate;

the front side of the silicon substrate having a first region and a second region, and removing the borosilicate glass layer and the boron diffusion layer in the second region by using laser;

wherein wet oxygen and dry oxygen are introduced during the boron diffusion on the silicon substrate with a ratio $\omega$ of the wet oxygen to the dry oxygen satisfying $0\%<\omega\leq20\%$; a density $\rho1$ of the borosilicate glass layer satisfies $1.32 \text{ g/cm}^3<\rho1\leq2.65 \text{ g/cm}^3$.

In the embodiment, by introducing wet oxygen and dry oxygen and controlling the ratio of wet oxygen to dry oxygen during the boron diffusion, the density of the formed borosilicate glass layer can be controlled, so that the density $\rho1$ of the borosilicate glass layer satisfies $1.32 \text{ g/cm}^3<\rho1\leq2.65 \text{ g/cm}^3$. Compared to the borosilicate glass layer formed in related art, the borosilicate glass layer formed by this preparation method has a lower density, which facilitates laser removal, reducing the energy density required for the laser to remove the borosilicate glass layer, and thereby lessening thermal damage to the silicon substrate or other regions caused by the laser during operation.

Consequently, the preparation quality of the solar cell and the economic efficiency of the preparation process can be improved.

In an embodiment, in the step of removing the borosilicate glass layer and the boron diffusion layer in the second region by using laser, an energy density $\gamma1$ required for the laser to remove the borosilicate glass layer and the boron diffusion layer decreases as the ratio $\omega$ of the wet oxygen to the dry oxygen increases. In another embodiment, an energy density $\gamma1$ required for the laser to remove the borosilicate glass layer and the boron diffusion layer is inversely proportional to the ratio $\omega$ of the wet oxygen to the dry oxygen.

In an embodiment, a ratio of the energy density $\gamma1$ required for the laser to remove the borosilicate glass layer and the boron diffusion layer to a rated energy density $\gamma$ of the laser satisfies $0.5\leq\gamma1/\gamma<1$.

In an embodiment, when the wet oxygen and the dry oxygen are introduced during the boron diffusion on the silicon substrate with a ratio $\omega$ of the wet oxygen to the dry oxygen satisfying 0% to 20%, a flow rate of the wet oxygen is in a range from 1000 sccm to 2000 sccm, and a flow rate of the dry oxygen is in a range from 2000 sccm to 20000 sccm.

In an embodiment, in the step of removing the borosilicate glass layer and the boron diffusion layer in the second region by using laser, the laser is a red nanosecond laser or a green nanosecond laser, and the laser has a nanosecond pulse width of 20 ns to 200 ns, a scanning speed of 8000 mm/s to 50000 mm/s, and a power of 30 W to 50 W.

In an embodiment, in the step of performing boron diffusion on the silicon substrate to form the boron diffusion layer and the borosilicate glass layer on both the front side and the back side of the silicon substrate, a thickness D1 of the borosilicate glass layer satisfies 40 nm to 80 nm.

In an embodiment, in the step of performing boron diffusion on the silicon substrate to form the boron diffusion layer and the borosilicate glass layer on both the front side and the back side of the silicon substrate, the oxygen is introduced at a flow rate of 2000 sccm to 20000 sccm, a temperature is in a range from 850° C. to 1000° C., and a tube furnace pressure is in a range from 740 mBar to 760 mBar.

In an embodiment, after the step of the front side of the silicon substrate having the first region and the second region and removing the borosilicate glass layer and the boron diffusion layer in the second region by using laser, the method further including:

removing the boron diffusion layer and the borosilicate glass layer on the back side of the silicon substrate;

sequentially forming a tunnelling oxide layer, a phosphorus diffusion layer, and a phosphosilicate glass layer on the front side and the back side of the silicon substrate;

the back side of the silicon substrate having a third region and a fourth region, removing the tunnelling oxide layer, the phosphorus diffusion layer, and the phosphosilicate glass layer in the fourth region;

removing the phosphosilicate glass layer on the front side of the silicon substrate;

performing secondary texturing on the silicon substrate;

depositing a passivation layer on the front side and the back side of the silicon substrate; and preparing electrodes in the first region and the third region.

In an embodiment, the step of performing secondary texturing on the silicon substrate specifically includes:

removing the phosphorus diffusion layer and the tunnelling oxide layer on the front side of the silicon substrate, and the phosphosilicate glass layer on the back side of the silicon substrate, and texturing a surface of the silicon substrate corresponding to the second region and the fourth region to form a textured surface.

In a second aspect, an embodiment of the present application provides a solar cell prepared by the above-described method. The solar cell includes, in a thickness direction of the solar cell, a first electrode, a first passivation layer, a boron diffusion layer, a silicon substrate, a tunnelling oxide layer, a phosphorus diffusion layer, a second passivation layer, and a second electrode that are sequentially stacked.

In an embodiment, a surface of the silicon substrate corresponding to the first region, the second region, and the fourth region is a textured surface; and a surface of the silicon substrate corresponding to the third region is a polished surface.

In a third aspect, an embodiment of the present application further provides a photovoltaic module including the solar cell described above.

BRIEF DESCRIPTION OF THE DRAWINGS

To illustrate the technical solutions in the embodiments of the present application more clearly, the drawings required for describing the embodiments will be briefly introduced below. Obviously, the drawings in the following description are only some embodiments of the present application. For those of ordinary skill in the art, other drawings can be obtained from these drawings without creative effort.

FIG. 9 is a schematic structural view corresponding to step S17 of the method for preparing a solar cell provided by the present application.

FIG. 10 is a schematic structural view corresponding to step S18 of the method for preparing a solar cell provided by the present application.

FIG. 11 is a schematic structural view corresponding to step S19 of the method for preparing a solar cell provided by the present application.

REFERENCE NUMERALS

Figure 1:
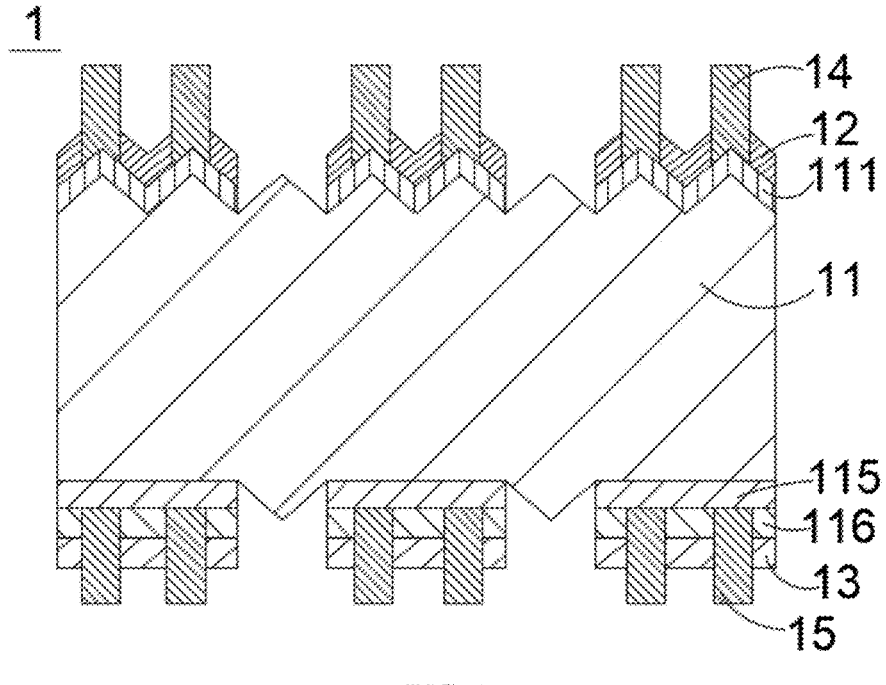
FIG. 1 is a schematic structural view of a solar cell according to an embodiment of the present application.

1—solar cell;
11—silicon substrate; 111—boron diffusion layer; 112—borosilicate glass layer; 113—first region; 114—second region; 115—tunnelling oxide layer; 116—phosphorus diffusion layer; 117—phosphosilicate glass layer; 118—third region; 119—fourth region;
12—first passivation layer;
13—second passivation layer;
14—first electrode;
15—second electrode.

DETAILED DESCRIPTION

For a better understanding of the technical solutions of the present application, the embodiments of the present application are described in detail below with reference to the accompanying drawings.

It should be understood that the described embodiments are only a part of the embodiments of the present application, but not all of them. Based on the embodiments in the present application, all other embodiments obtained by those of ordinary skill in the art without creative efforts shall fall within the protection scope of the present application.

The terms used in the embodiments of the present application are merely for the purpose of describing specific embodiments, and are not intended to limit the present application. The singular forms "a/an", "the", and "said" used in the embodiments of the present application as well as in the appended claims are also intended to include plural forms, unless the context clearly indicates otherwise.

It should be understood that the term "and/or" used herein is only a way to describe an association relationship of associated objects, indicating that three relationships may exist. For example, "A and/or B" may indicate: A exists alone, both A and B exist, or B exists alone. In addition, the character "/" in the context generally indicates that the associated objects before and after it are in an "or" relationship.

Photovoltaic cells, which can convert solar energy into electrical energy, offer advantages such as no pollution, no geographical restrictions, and inexhaustibility, and are regarded as a major direction in new energy development. As a type of photovoltaic cell, Topcon cells significantly improve photoelectric conversion efficiency by providing a passivation contact structure composed of an ultra-thin silicon oxide layer and a doped polysilicon layer. By optimizing the structures of the front and back sides of Topcon cells, they can not only receive direct sunlight on the front side but also utilize reflected light, thereby enhancing overall photoelectric conversion efficiency. Laser patterning is required during the preparation of TOPCon cells. To ensure the effect of laser patterning, the energy density of the laser needs to be increased, which is prone to causing thermal damage to the silicon substrate of the cell, compromising the preparation quality.

To address the above-mentioned technical issues, an embodiment of the present application provides a method for preparing a solar cell 1, as shown in FIGS. 1 to 4. The method can includes but is not limited to the steps of:

S11: performing double-sided texturing on a silicon substrate 11;

S12: performing boron diffusion on the silicon substrate 11 to form a boron diffusion layer 111 and a borosilicate glass layer 112 on both a front side and a back side of the silicon substrate 11;

S13: the front side of the silicon substrate 11 having a first region 113 and a second region 114, and removing the borosilicate glass layer 112 and the boron diffusion layer 111 in the second region 114 by using laser;

wherein during the boron diffusion on the silicon substrate 11, step S12 can further specifically include:

S121: introducing wet oxygen and dry oxygen with a ratio ω of wet oxygen to dry oxygen satisfying 0%<ω≤20%, and a density ρ1 of the borosilicate glass layer satisfying 1.32 g/cm³<ρ1≤2.65 g/cm³.

In the embodiment, by introducing wet oxygen and dry oxygen and controlling the ratio of wet oxygen to dry oxygen during the boron diffusion, the density of the formed borosilicate glass layer 112 can be controlled, so that the density ρ1 of the borosilicate glass layer 112 satisfies 1.32 g/cm³<ρ1≤2.65 g/cm³. Compared to the borosilicate glass layer 112 formed in related art, the borosilicate glass layer 112 formed by this preparation method has a lower density, which facilitates laser removal, reducing the energy density required for the laser to remove the borosilicate glass layer 112, and thereby lessening thermal damage to the silicon substrate or other regions caused by the laser during operation. Consequently, the preparation quality of the solar cell and the economic efficiency of the preparation process can be improved.

Herein, the ratio ω of wet oxygen to dry oxygen can be 5%, 12%, 15%, 18%, 20%, etc., and the density ρ1 of the borosilicate glass layer 112 can be 1.34 g/cm³, 1.64 g/cm³, 2.00 g/cm³, 2.34 g/cm³, 2.65 g/cm³, etc.

In other embodiments, the ratio ω of wet oxygen to dry oxygen and the density ρ1 of the borosilicate glass layer 112 can also be other values. The specific values of ω and ρ1 are not limited in the embodiments of the present application and can be adaptively adjusted according to actual conditions.

In an embodiment, as shown in FIGS. 1, 5 to 10, after step S13, The method for preparing the solar cell 11 can include but is not limited to the steps of:

S14: removing the boron diffusion layer 111 and the borosilicate glass layer 112 on the back side of the silicon substrate 11;

S15: sequentially forming a tunnelling oxide layer 115, a phosphorus diffusion layer 116, and a phosphosilicate glass layer 117 on the front side and the back side of the silicon substrate 11;

S16: the back side of the silicon substrate 11 having a third region 118 and a fourth region 119, removing the tunnelling oxide layer 115, the phosphorus diffusion layer 116, and the phosphosilicate glass layer 117 in the fourth region 119;

S17: removing the phosphosilicate glass layer 117 on the front side of the silicon substrate 11;

S18: performing secondary texturing on the silicon substrate 11;

S19: depositing a passivation layer on the front side and the back side of the silicon substrate 11; and S20: preparing electrodes in the first region 113 and the third region 118.

In the embodiment, through the aforementioned preparation steps S14 to S20, a passivation contact structure composed of the tunnelling oxide layer 115 and the phosphorus diffusion layer 116 can be formed on the back side of the silicon substrate 11 to enhance the open-circuit voltage and fill factor of the solar cell 1, reduce surface recombination, and also retain the ability to absorb reflected or scattered light. Meanwhile, through steps S11 to S13, the boron diffusion layer 111 and the passivation layer are provided on the front side of the silicon substrate 11, enabling efficient absorption of direct incident light from the front side. In summary, by optimizing the structures of both the front and back sides of the solar cell 1, the solar cell 1 can achieve a high bifaciality, thereby further improving the overall working efficiency of the solar cell 1.

As shown in FIG. 1, an embodiment of the present application provides a solar cell 1 prepared by the preparation method described above. The solar cell 1 includes, in a thickness direction thereof, a first electrode 14, a first passivation layer 12, the boron diffusion layer 111, the silicon substrate 11, the tunnelling oxide layer 115, the phosphorus diffusion layer 116, a second passivation layer 13, and a second electrode 15 that are sequentially stacked.

In the embodiment, the solar cell 1 prepared by the method described above is provided with a tunnelling oxide layer 115 and a phosphorus diffusion layer 116 on the back side thereof to form a passivation contact structure, which can significantly reduce surface recombination loss, enhance open-circuit voltage and fill factor, thereby enhancing the working efficiency of the solar cell 1. Meanwhile, only a boron diffusion layer 111 is provided on the front side of the solar cell. Compared to solar cells in related art where both sides are provided with diffusion layers and tunnel layers, this design can further simplify the preparation process and save preparation costs while ensuring performance requirements.

Additionally, the preparation method described above can reduce damage caused by the laser to the front side of the silicon substrate 11 during the preparation of the solar cell 1, thereby improving the preparation quality of the solar cell 1.

Herein, the front side of the solar cell 1 provided in the embodiments of the present application is provided with a first electrode 14. The projection of the first electrode 14 in the thickness direction of the solar cell 1 is located in the first region 113, and the second region 114 is a region outside the first region 113. Meanwhile, the back side of the solar cell 1 is provided with a second electrode 15. The projection of the second electrode 15 in the thickness direction of the solar cell 1 is located in the third region 118, and the fourth region 119 is a region outside the third region 118.

Figure 2:
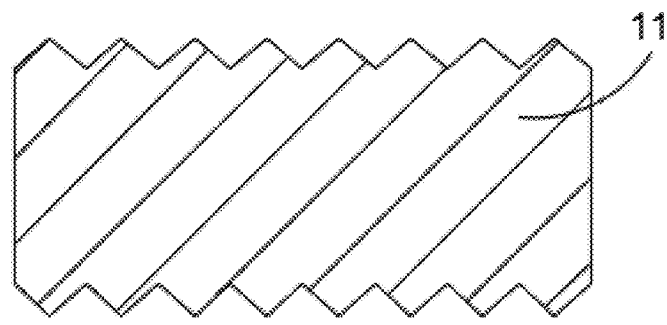
FIG. 2 is a schematic structural view corresponding to step S11 of a method for preparing a solar cell provided by the present application.
Figure 3:
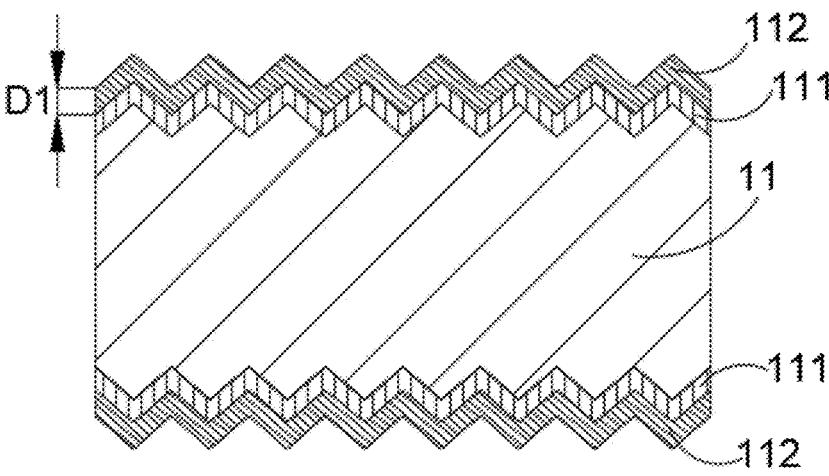
FIG. 3 is a schematic structural view corresponding to step S12 of the method for preparing a solar cell provided by the present application.
Figure 4:
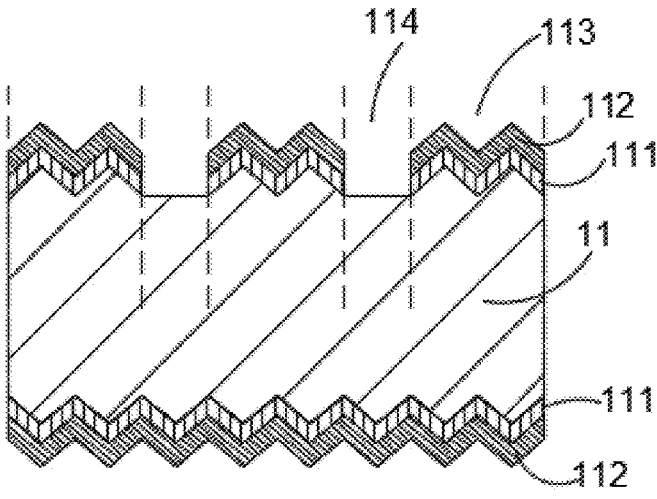
FIG. 4 is a schematic structural view corresponding to step S13 of the method for preparing a solar cell provided by the present application.
Figure 5:
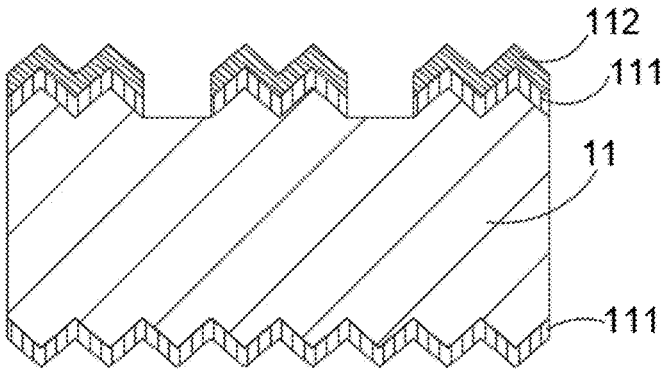
FIG. 5 is a schematic structural view corresponding to step S14 of the method for preparing a solar cell provided by the present application.
Figure 6:
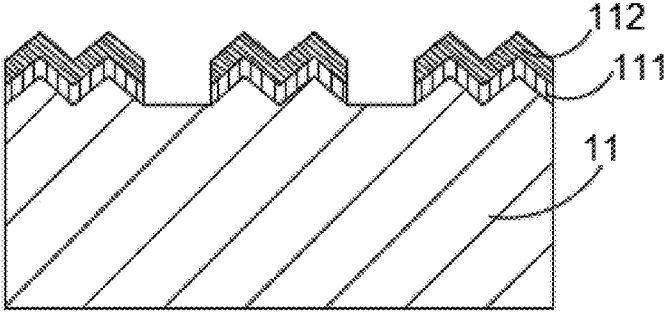
FIG. 6 is a schematic structural view corresponding to step S14 of the method for preparing a solar cell provided by the present application.
Figure 7:
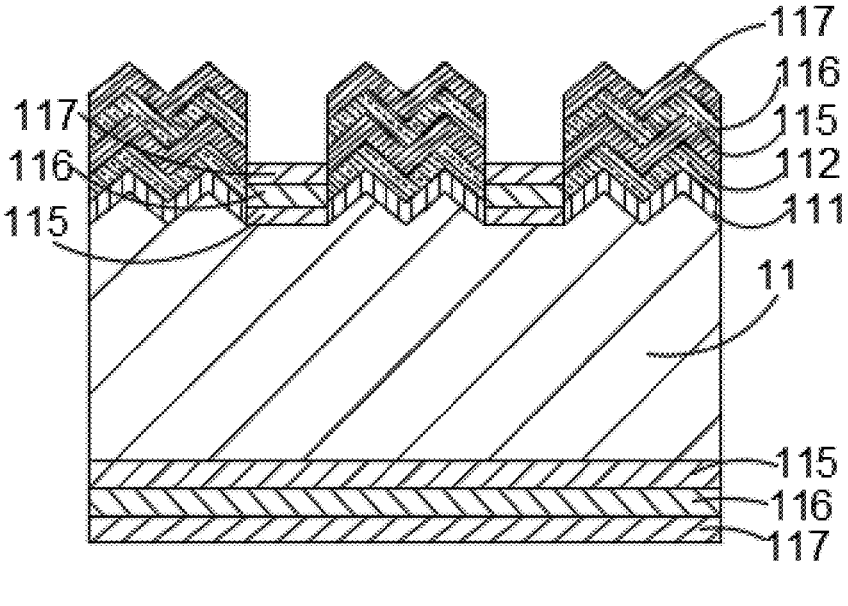
FIG. 7 is a schematic structural view corresponding to step S15 of the method for preparing a solar cell provided by the present application.
Figure 8:
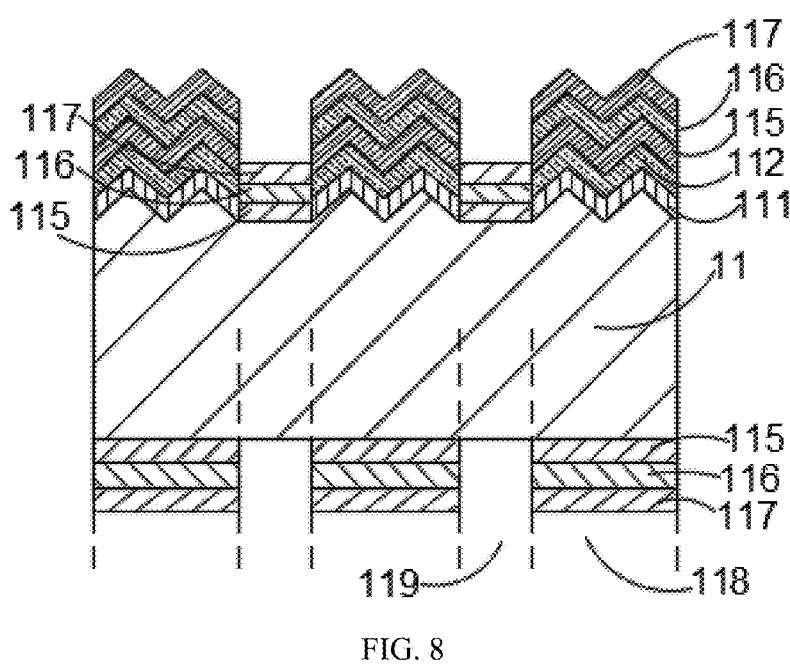
FIG. 8 is a schematic structural view corresponding to step S16 of the method for preparing a solar cell provided by the present application.

In an embodiment, as shown in FIGS. 2 to 4, in the step S121, an energy density γ1 required for the laser to remove the borosilicate glass layer 112 and the boron diffusion layer 111 decreases as the ratio ω of the wet oxygen to the dry oxygen increases. In another embodiment, an energy density γ1 required for the laser to remove the borosilicate glass layer 112 and the boron diffusion layer 111 is inversely proportional to the ratio ω of wet oxygen to dry oxygen.

In the embodiments, the relationship between the energy density required for the laser to remove the borosilicate glass layer 112 and the boron diffusion layer 111 and the ratio ω of the wet oxygen to the dry oxygen can satisfy the following formulas:

$$\rho 1 = (1 - 2.5\omega) \times \rho \qquad (1)$$

$$\gamma 1 = \frac{\gamma}{\rho} \times \rho 1 \qquad (2)$$

where ρ1 is the density of the borosilicate glass layer 112 prepared by the method of the present application, p is the density of the borosilicate glass layer in related art, γ is the rated energy density of the laser. The aforementioned formula (1) and formula (2) are derived from experimental data. From formula (1) and formula (2), the following relationship between γ1 and ω can be obtained:

$$\gamma 1 = \gamma \times (1 - 1.25\omega) \qquad (3)$$

$$V1 = \gamma/\gamma 1 \times V \qquad (4)$$

Combining formulas (1), (2), and (3), it can be concluded that when the ratio of wet oxygen to dry oxygen increases, the density of the prepared borosilicate glass layer 112 decreases, thereby reducing the energy density required for the laser to remove the borosilicate glass layer 112 and the boron diffusion layer 111. Consequently, the thermal damage caused by the laser to the silicon substrate 111 can be reduced.

Since the density of the borosilicate glass layer 112 is higher than that of the boron diffusion layer 111, the laser can sequentially remove the borosilicate glass layer 112 and the boron diffusion layer 111.

In an embodiment, as shown in FIG. 3, step S121 described above can further include:

S1211: introducing wet oxygen at a flow rate of 1000 sccm to 2000 sccm and dry oxygen at a flow rate of 2000 sccm to 20000 sccm during boron diffusion on the silicon substrate 11.

In the embodiment, the flow rate of the introduced wet oxygen can be in a range from 1000 sccm to 2000 sccm, specifically can be, for example, 1000 sccm, 1500 sccm, 2000 sccm, etc. The flow rate of the introduced dry oxygen can be in a range from 2000 sccm to 20000 sccm, specifically can be, for example, 2000 sccm, 10000 sccm, 20000 sccm, etc., which ensures that the ratio $\omega$ of the introduced wet oxygen to dry oxygen satisfies $0\% < \omega \leq 20\%$, reducing the density of the formed borosilicate glass layer 112 on the basis of meeting the requirements of the boron diffusion process, thereby lowering the energy density required for the laser to remove the borosilicate glass layer 112. Consequently, thermal damage to the silicon substrate 11 caused by the laser can be reduced.

In other embodiments, the flow rates of the introduced dry oxygen and wet oxygen can also be other values. The specific flow rate values of the introduced dry oxygen and wet oxygen are not limited in the embodiments of the present application and can be adaptively adjusted according to actual conditions.

In the embodiments described above, as shown in FIGS. 2 to 4, a ratio of the energy density $\gamma 1$ required for the laser to remove the borosilicate glass layer 112 and the boron diffusion layer 111 to the rated energy density $\gamma$ of the laser satisfies $0.5 < \gamma 1/\gamma < 1$.

In the embodiments, by controlling the ratio of wet oxygen to dry oxygen during boron diffusion, the density of the formed borosilicate glass layer 112 can be controlled. The smaller the density, the lower the energy density required for the laser. When the density $\rho 1$ of the borosilicate glass layer 112 satisfies $1.32 \text{ g/cm}^3 < \rho 1 \leq 2.65 \text{ g/cm}^3$, it can be seen from the formula (3) described above that the ratio of the energy density required for the laser to the rated energy density of the laser can satisfy $0.5 \leq \gamma 1/\gamma < 1$, for example, specifically can be 0.5, 0.7, 0.9, etc., which ensures that the laser can meet the requirements for patterning while the energy density required for the laser can be significantly reduced.

In the embodiments described above, as shown in FIGS. 2 to 4, after reducing the energy density of the laser by adjusting the density of the borosilicate glass layer 112, the speed at which the laser removes the borosilicate glass layer 112 and the boron diffusion layer 111 can also be increased. Specifically, an increased laser speed V1 can satisfy the following formula:

where V is the rated speed of the laser. The formula (4) described above can be derived from the general calculation formula for laser energy density (The general calculation formula for laser energy density is $\gamma = P/VS$, where P is the laser power, and S is the spot area. When the values of P and S are constant, the laser energy density is inversely proportional to the speed). From formula (4), it can be seen that when the ratio of the rated energy density of the laser to the energy density required for the laser in the embodiments of the present application satisfies 0.5 to 1, the laser speed V1 in the embodiments of the present application can be up to twice the rated laser speed V. Consequently, the preparation efficiency of the solar cell can be further improved by increasing the speed of laser patterning.

In an embodiment, as shown in FIGS. 2 to 4, in the step of removing the borosilicate glass layer 112 and the boron diffusion layer 111 in the second region 114 by using laser, the laser can be a red nanosecond laser or a green nanosecond laser.

In the embodiment, the red nanosecond laser or green nanosecond laser is selected for its low penetration power. When removing the borosilicate glass layer 112 and the boron diffusion layer 111 in the second region 114, it can reduce thermal damage to the silicon substrate 11, thereby improving the preparation quality of the subsequently prepared solar cell. Meanwhile, red nanosecond lasers and green nanosecond lasers also have the advantages of high precision, simple use, and low maintenance costs, which can reduce the preparation difficulty and cost of solar cells.

Additionally, the nanosecond pulse width of the laser can be in a range from 20 ns to 200 ns, for example, 20 ns, 100 ns, 200 ns, etc. The scanning speed can be in a range from 8000 mm/s to 50000 mm/s, for example, 8000 mm/s, 25000 mm/s, 50000 mm/s, etc., and the power can be in a range from 30 W to 50 W, for example, 30 W, 40 W, 50 W, etc. By controlling the parameters of the red or green nanosecond laser in combination with the borosilicate glass layer 112 of relatively low density, damage-free patterning can be achieved on the silicon substrate 11 during the solar cell preparation. Thereby, the preparation quality of the patterned structure on the front side of the solar cell can be improved, enhancing the open-circuit voltage, fill factor, and conversion efficiency of the solar cell.

In other embodiments, the nanosecond pulse width, scanning speed, and power of the laser can also be other values. The specific nanosecond pulse width, scanning speed, and power of the laser are not limited in the embodiments of the present application and can be adaptively adjusted according to actual conditions.

In an embodiment, as shown in FIG. 3, in step S12, a thickness D1 of the formed borosilicate glass layer 112 can satisfy 40 nm to 80 nm.

In the embodiment, the thickness of the borosilicate glass layer 112 can be in a range from 40 nm to 80 nm, for example, the thickness of the borosilicate glass layer 112 can be 40 nm, 50 nm, 60 nm, 70 nm, 80 nm, etc. Compared to a relatively thick borosilicate glass layer in related art, in the embodiments of the present application, limiting the thickness of the formed borosilicate glass layer 112 can further reduce the energy density required for the laser to remove the borosilicate glass layer 112, thereby lessening thermal damage to the silicon substrate 11 caused by the laser and improving the preparation quality of the solar cell.

In other embodiments, the thickness of the borosilicate glass layer 112 can also be other values. The specific thickness of the borosilicate glass layer 112 is not limited in the embodiments of the present application and can be adaptively adjusted according to actual conditions.

In the embodiments described above, as shown in FIG. 3, during the formation of the boron diffusion layer 111 and the borosilicate glass layer 112, a flow rate of the introduced oxygen can be in a range from 2000 sccm to 20000 sccm, a temperature can be in a range from 850° C. to 1000° C., and a tube furnace pressure can be in a range from 740 mBar to 760 mBar.

In the embodiment, the formation of the boron diffusion layer 111 and the borosilicate glass layer 112 can also include steps such as temperature raising, temperature holding, oxidation, and cooling. During these steps, the flow rate of the introduced oxygen can controlled to be in a range from 2000 sccm to 20000 sccm, the temperature can be controlled to be in a range from 850° C. to 1000° C., and the tube furnace pressure can be controlled to be in a range from 740 mBar to 760 mBar, thereby limiting the thickness of the formed borosilicate glass layer 112. Consequently, the energy density required for the laser to subsequentially remove the borosilicate glass layer 112 and the boron diffusion layer 111 can be reduced, thereby lessening thermal damage to the silicon substrate 11 caused by the laser.

Herein, the flow rate of the introduced oxygen can be 2000 sccm, 7000 sccm, 12000 sccm, 16000 sccm, 20000 sccm, etc. The temperature can be 850° C., 900° C., 920° C., 960° C., 1000° C., etc. The tube furnace pressure can be 740 mBar, 745 mBar, 750 mBar, 755 mBar, 760 mBar, etc. In other embodiments, the flow rate of the introduced oxygen, the temperature, and the tube furnace pressure can also be other values. The specific values of these three parameters are not limited in the embodiments of the present application and can be adaptively adjusted according to specific conditions.

In an embodiment, as shown in FIGS. 9 and 10, step S18 described above can further include:

S181: removing the phosphorus diffusion layer 116 and the tunnelling oxide layer 115 on the front side of the silicon substrate 11, and the phosphosilicate glass layer 117 on the back side of the silicon substrate 11, and texturing a surface of the silicon substrate 11 corresponding to the second region 114 and the fourth region 119 to form a textured surface.

In the embodiment, by performing secondary texturing on the silicon substrate 11, part of the target structural layers can be removed, and the surface of the silicon substrate 11 corresponding to the second region 114 and the fourth region 119 can be made textured. This increases the effective surface area of the second region 114 and the fourth region 119, enhancing the light absorption effect, thereby further improving the working efficiency of the solar cell.

In an embodiment, as shown in FIG. 1, the surface of the silicon substrate 11 corresponding to the first region 113, the second region 114, and the fourth region 119 can be a textured surface, and the surface of the silicon substrate 11 corresponding to the third region 118 can be a polished surface.

In the embodiment, making the surface of the silicon substrate 11 corresponding to the first region 113 textured can increase the effective surface area of the first region 113, optimize carrier transport, and improve the fill factor. Furthermore, making the surface of the silicon substrate 11 corresponding to the second region 114 and the fourth region 119 textured can increase the effective surface areas of the second region 114 and the fourth region 119, enhancing the light absorption effect in the second region 114 and the fourth region 119. Meanwhile, making the surface of the silicon substrate 11 corresponding to the third region 118 polished allows the tunnelling oxide layer 115 and the phosphorus diffusion layer 116 deposited thereon to be more uniform, improving the passivation effect.

Embodiments of the present application also provide a photovoltaic module. The photovoltaic module can include the solar cell 1 described in the above embodiments, photovoltaic glass, an adhesive film, a backsheet, and a frame. By using the solar cell 1 prepared by the method described in the above embodiments, the overall operational performance of the photovoltaic module can be ensured by improving the preparation quality of the solar cell 1.

The foregoing descriptions are merely preferred embodiments of the present application and are not intended to limit the present application. For those skilled in the art, various modifications and changes can be made to the present application. Any modification, equivalent replacement, or improvement made within the spirit and principles of the present application shall be included within the scope of protection of the present application.

What is claimed is:

1. A method for preparing a solar cell, comprising:
    performing double-sided texturing on a silicon substrate;
    performing boron diffusion on the silicon substrate to form a boron diffusion layer and a borosilicate glass layer on both a front side and a back side of the silicon substrate;
    the front side of the silicon substrate having a first contact region and a first non-contact region, and removing the borosilicate glass layer and the boron diffusion layer in the first non-contact region by using laser;
    wherein wet oxygen and dry oxygen are introduced during the boron diffusion on the silicon substrate with a ratio $\omega$ of the wet oxygen to the dry oxygen satisfying $0\% < \omega \leq 20\%$; a density $\rho 1$ of the borosilicate glass layer satisfies $1.32$ g/cm$^3$ $< \rho 1 \leq 2.65$ g/cm$^3$.

2. The method of claim 1, wherein in the step of removing the borosilicate glass layer and the boron diffusion layer in the first non-contract region by using laser, an energy density $\gamma 1$ required for the laser to remove the borosilicate glass layer and the boron diffusion layer is inversely proportional to the ratio $\omega$ of the wet oxygen to the dry oxygen.

3. The method of claim 2, wherein a ratio of the energy density $\gamma 1$ required for the laser to remove the borosilicate glass layer and the boron diffusion layer to a rated energy density $\gamma$ of the laser satisfies $0.5 \leq \gamma 1/\gamma < 1$.

4. The method of claim 1, wherein when the wet oxygen and the dry oxygen are introduced during the boron diffusion on the silicon substrate with a ratio $\omega$ of the wet oxygen to the dry oxygen satisfying 0% to 20%, a flow rate of the wet oxygen is in a range from 1000 sccm to 2000 sccm, and a flow rate of the dry oxygen is in a range from 2000 sccm to 20000 sccm.

5. The method of claim 3, wherein in the step of removing the borosilicate glass layer and the boron diffusion layer in the first non-contact region by using laser, the laser is a red nanosecond laser.

6. The method of claim 5, wherein the laser has a nanosecond pulse width of 20 ns to 200 ns, a scanning speed of 8000 mm/s to 50000 mm/s, and a power of 30 W to 50 W.

7. The method of claim 3, wherein in the step of removing the borosilicate glass layer and the boron diffusion layer in the first non-contact region by using laser, the laser is a green nanosecond laser.

8. The method of claim 7, wherein the laser has a nanosecond pulse width of 20 ns to 200 ns, a scanning speed of 8000 mm/s to 50000 mm/s, and a power of 30 W to 50 W.

9. The method of claim 1, wherein in the step of performing the boron diffusion on the silicon substrate to form the boron diffusion layer and the borosilicate glass layer on both the front side and the back side of the silicon substrate, a thickness D1 of the borosilicate glass layer satisfies 40 nm to 80 nm.

10. The method of claim 9, wherein in the step of performing the boron diffusion on the silicon substrate to form the boron diffusion layer and the borosilicate glass layer on both the front side and the back side of the silicon substrate, the oxygen is introduced at a flow rate of 2000 sccm to 20000 sccm, a temperature is in a range from 850° C. to 1000° C., a tube furnace pressure is in a range from 740 mBar to 760 mBar.

11. The method of claim 1, wherein after the step of the front side of the silicon substrate having the first contact region and the first non-contact region and removing the borosilicate glass layer and the boron diffusion layer in the first non-contact region by using laser, the method further comprising:
    removing the boron diffusion layer and the borosilicate glass layer on the back side of the silicon substrate;
    sequentially forming a tunnelling oxide layer, a phosphorus diffusion layer, and a phosphosilicate glass layer on the front side and the back side of the silicon substrate;
    the back side of the silicon substrate having a second contact region and a second non-contact region, removing the tunnelling oxide layer, the phosphorus diffusion layer, and the phosphosilicate glass layer in the second non-contact region;
    removing the phosphosilicate glass layer on the front side of the silicon substrate;
    performing secondary texturing on the silicon substrate;
    depositing a passivation layer on the front side and the back side of the silicon substrate; and
    preparing electrodes in the first contact region and the second contact region.

12. The method of claim 11, wherein the step of performing secondary texturing on the silicon substrate comprises:
    removing the phosphorus diffusion layer and the tunnelling oxide layer on the front side of the silicon substrate, and the phosphosilicate glass layer on the back side of the silicon substrate, and
    texturing a surface of the silicon substrate corresponding to the first non-contact region and the second non-contact region to form a textured surface.

13. The method of claim 3, wherein after the step of the front side of the silicon substrate having the first contact region and the first non-contact region and removing the borosilicate glass layer and the boron diffusion layer in the first non-contact region by using laser, the method further comprising:
    removing the boron diffusion layer and the borosilicate glass layer on the back side of the silicon substrate;
    sequentially forming a tunnelling oxide layer, a phosphorus diffusion layer, and a phosphosilicate glass layer on the front side and the back side of the silicon substrate;
    the back side of the silicon substrate having a second contact region and a second non-contact region, removing the tunnelling oxide layer, the phosphorus diffusion layer, and the phosphosilicate glass layer in the second non-contact region;
    removing the phosphosilicate glass layer on the front side of the silicon substrate;
    performing secondary texturing on the silicon substrate;
    depositing a passivation layer on the front side and the back side of the silicon substrate; and
    preparing electrodes in the first contact region and the second contact region.

14. The method of claim 13, wherein the step of performing secondary texturing on the silicon substrate comprises:
    removing the phosphorus diffusion layer and the tunnelling oxide layer on the front side of the silicon substrate, and the phosphosilicate glass layer on the back side of the silicon substrate, and
    texturing a surface of the silicon substrate corresponding to the first non-contact region and the second non-contact region to form a textured surface.

15. The method of claim 1, wherein the step of performing the boron diffusion on the silicon substrate to form the boron diffusion layer and the borosilicate glass layer on both the front side and the back side of the silicon substrate further comprises temperature raising, temperature holding, oxidation, and cooling.

16. The method of claim 15, wherein in steps of the temperature raising, temperature holding, oxidation, and cooling, the oxygen is introduced at a flow rate of 2000 sccm to 20000 sccm, the temperature is in a range from 850° C. to 1000° C., and the tube furnace pressure is in a range from 740 mBar to 760 mBar.

17. The method of claim 11, wherein a surface of the silicon substrate corresponding to the second contact region is a polished surface.

18. The method of claim 11, wherein a surface of the silicon substrate corresponding to the first contact region, the first non-contact region, and the second non-contact region is a textured surface.

19. The method of claim 1, wherein a ratio of energy density $\gamma1$ required for the laser to remove the borosilicate glass layer and the boron diffusion layer to a rated energy density $\gamma$ of the laser satisfies $\gamma1/\gamma=0.5$.

20. The method of claim 11, wherein the tunnelling oxide layer and the phosphorus diffusion layer that are located in the second contact region forms a passivation contact structure.

* * * * *